(12) United States Patent
Brown et al.

(10) Patent No.: US 11,705,429 B2
(45) Date of Patent: Jul. 18, 2023

(54) REDUNDANT THROUGH-SILICON VIAS

(71) Applicant: Micron Technology, Inc., Boise, ID (US)

(72) Inventors: Jason M. Brown, Allen, TX (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/013,225

(22) Filed: Sep. 4, 2020

(65) Prior Publication Data

US 2022/0077112 A1    Mar. 10, 2022

(51) Int. Cl.
| | | |
|---|---|---|
| *G11C 11/00* | (2006.01) | |
| *H01L 25/065* | (2023.01) | |
| *G11C 13/00* | (2006.01) | |
| *G11C 29/00* | (2006.01) | |
| *H10B 63/00* | (2023.01) | |

(52) U.S. Cl.
CPC ........ *H01L 25/0657* (2013.01); *G11C 13/004* (2013.01); *G11C 13/0069* (2013.01); *G11C 29/702* (2013.01); *G11C 13/003* (2013.01); *G11C 13/0026* (2013.01); *G11C 13/0028* (2013.01); *G11C 2013/0045* (2013.01); *H01L 2225/06544* (2013.01); *H10B 63/84* (2023.02)

(58) Field of Classification Search
CPC ............. H01L 25/0657; H01L 27/2481; H01L 2225/06544; G11C 13/004; G11C 13/0069; G11C 29/702; G11C 13/0026; G11C 13/0028; G11C 13/003; G11C 2013/0045

See application file for complete search history.

(56) References Cited

U.S. PATENT DOCUMENTS

| | | |
|---|---|---|
| 9,407,273 B1 | 8/2016 | Wei et al. |
| 9,455,726 B1 | 9/2016 | Wei et al. |
| 9,614,533 B2 | 4/2017 | Wei et al. |
| 10,270,453 B2 | 4/2019 | Wei et al. |
| 10,381,055 B2 | 8/2019 | Qawami et al. |
| 10,454,484 B1 | 10/2019 | Shi et al. |
| 10,468,386 B1 | 11/2019 | Sato et al. |

(Continued)

FOREIGN PATENT DOCUMENTS

| | | |
|---|---|---|
| CN | 104133732 B | 11/2014 |
| TW | 201937498 A | 9/2019 |

OTHER PUBLICATIONS

U.S. Appl. No. 16/975,619, filed Aug. 25, 2020, Ferdinando Bedeschi.

(Continued)

*Primary Examiner* — Uyen Smet
(74) *Attorney, Agent, or Firm* — Fletcher Yoder, P.C.

(57) ABSTRACT

A device may include a first die having a first circuit and a second die having a second circuit. The die may be separated by a material layer. The material layer may include multiple through-silicon vias (TSVs) for electrically coupling the first die to the second die. A first TSV of the TSVs may electrically couple the first circuit to the second circuit and a second TSV of the TSVs may include a redundant TSV that electrically bypasses the first TSV to couple the first circuit to the second circuit if a fault is detected in the first TSV.

19 Claims, 5 Drawing Sheets

(56) References Cited

U.S. PATENT DOCUMENTS

| | | | |
|---|---|---|---|
| 2011/0057819 A1* | 3/2011 | Ide | H01L 25/0657 |
| | | | 257/773 |
| 2011/0309518 A1* | 12/2011 | Kim | H04N 5/379 |
| | | | 257/E23.174 |
| 2013/0294184 A1* | 11/2013 | Yang | G11C 29/04 |
| | | | 365/200 |
| 2018/0096735 A1 | 4/2018 | Pappu | |
| 2018/0277175 A1* | 9/2018 | Kondo | G11C 7/1069 |
| 2019/0034370 A1 | 1/2019 | Kondo et al. | |
| 2019/0198099 A1 | 6/2019 | Mirichigni et al. | |
| 2021/0193623 A1* | 6/2021 | Oh | G11C 29/025 |

OTHER PUBLICATIONS

International Search Report and Written Opinion for PCT Application No. PCT/US2021/043422 dated Nov. 17, 2021 (11 pages).
First Office Action for TW Application No. 110130318 dated Jul. 14, 2022, 21 pages.

* cited by examiner

REDUNDANT THROUGH-SILICON VIAS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a word line or a bit line. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, word lines and bit lines are used to transmit selection signals to respective memory cells. The selection signals may include signals characterized by voltage levels used to save data into or retrieve data from the memory cells. The word lines and bit lines may couple to selection signal sources through drivers. The memory cells may be organized into one or more layers of memory cells, such as layers defined between overlapping word lines and bit lines. These layers may be referred to as decks (e.g., memory decks). Various combinations of the word lines, bit lines, and/or decoders may be referenced for use in a particular memory operation using addresses (e.g., memory addresses). The address may indicate which memory cell is to be selected using a combination of signals from the word lines, bit lines, and/or decoders, and a particular value of the address may be based on ranges of addresses of the memory device.

Threshold type memories and some other memories may use multiple layers of circuitry, such as stacked silicon layers, between decks and/or between control circuitry. Data and signals may be transmitted between the layers using through-silicon vias (TSVs). Many TSVs may be included and formed between the stacked layers of circuitry (e.g., stacked silicon layers), and thus hundreds of TSVs may be used in a memory device. When a manufactured stacked circuit includes one or more faulty TSVs, the entire circuit may be scrapped. This may be undesirable and generally inefficient since sometimes a single TSV may be faulty and still lead to disposal of entire circuit.

BRIEF DESCRIPTION OF THE DRAWINGS

Various aspects of this disclosure may better be understood upon reading the following detailed description and upon reference to the drawings in which.

DETAILED DESCRIPTION

Figure 1:
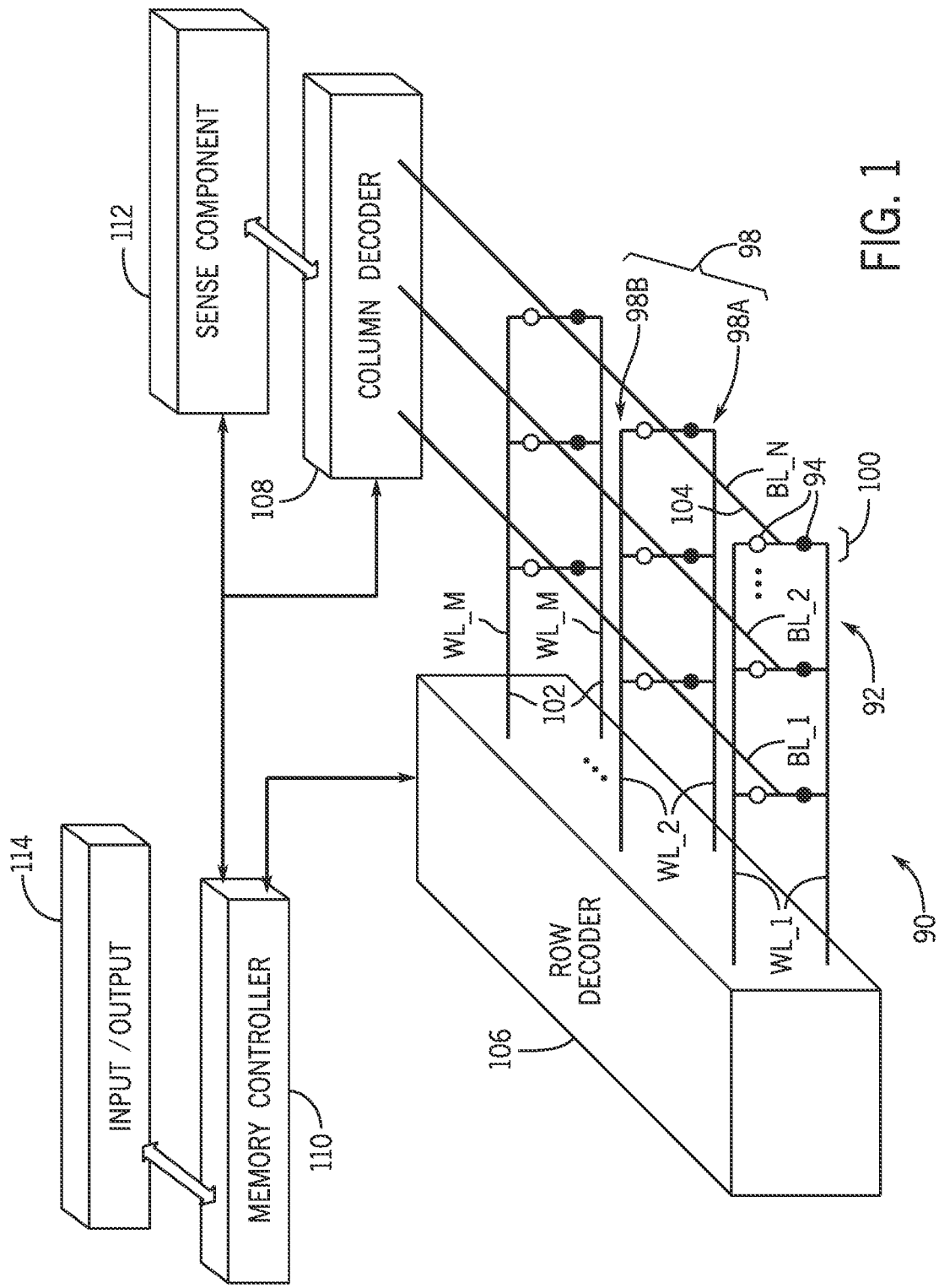
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bit line and a word line. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell. Access commands (e.g., read commands, write commands) may be used to generate the selection signals, such as by instructing which of the memory cells to read and/or write.

When manufacturing memory devices, such as memory devices that use threshold type memory cells, different layers of memory decks and/or memory control circuitry may be disposed on one another and may be desired to intercommunicate and/or transmit signals between the layers of circuitry. The various layers may be formed from Silicon, or another suitable material. Through-silicon vias (TSVs)

(or through-wafer vias) may be an approach used to communicatively couple between the layers of circuitry. However, TSVs may be unreliable and difficult to manufacture. Manufacturing complications from TSVs may mean that once a circuit is formed from multiple layers, there may be one or more TSVs that do not operate as expected, and thus may be faulty. A faulty TSV may also be identified when, during operation or after a time of manufacturing, a fault is detected by a controller or a testing system as in the TSV or as undesirably affecting TSV operation (e.g., how the TSV transmits a signal).

When a circuit is formed from multiple layers interconnected with TSVs, physical repair of the faulty TSV may be relatively difficult and involve invasive repairs based on breaking apart portions of the layers of circuitry to access the faulty TSV. In some manufacturing scenarios, invasive repairs may be costly and out of scope for the product being manufactured. Thus, it may be desirable to develop a solution that helps redirect data around a faulty TSV, such that full device repair or replacement may be avoided.

In accordance with embodiments of the present disclosure, buffer circuitry and selection circuitry may be included with TSV circuitry between the layers. The selection circuitry may include two or more transistors for each TSV shared by a single buffer circuit. To shift around a TSV (i.e., reroute to avoid a faulty TSV), the transistor for the faulty TSV may be turned off and an adjacent transistor may be turned on, permitting the signal for the TSV to be routed through an adjacent TSV. Routing (e.g., interconnections, data pathways) to TSVs that are downstream from the faulty TSV may be adjusted. Adjustments to the routing causes data to be shifted to adjacent TSVs to avoid the faulty TSV. This shifting may eventually cause data to be transmitted through a redundant TSV. The redundant TSV may have been unused in earlier transmissions of data, such as a transmission of data performed before the faulty TSV was identified (e.g., previously unused) and the routing performed.

It is noted that any number of redundant TSVs may be included to permit additional shifting and/or to permit replacement of any number of TSVs (e.g., when routing circuitry is also scaled based on the number of redundant TSVs included). It is also noted that similar shifting operations may be performed at another circuitry layer that also uses the TSVs being shifted. This may help align inputs/outputs between the circuitry layers.

In some cases, a self-test may be run during operation of the memory device. The self-test may identify whether any of the TSVs are faulty. The self-test may be performed during manufacturing or at some point after deployment in an electronic device and/or to a customer. Indeed, the self-test may adjust operation of the memory device over time, such as to identify faulty operation when the operation may be unnoticed otherwise.

Keeping the foregoing introduction in mind, FIG. 1 is a block diagram of a portion of a memory device 90. Memory device 90 may also be referred to as an electronic memory apparatus. FIG. 1 is an illustrative representation of various components and features of the memory device 90. As such, it should be appreciated that the components and features of the memory device 90 are shown to illustrate functional interrelationships, not their actual physical positions within the memory device 90. In the illustrative example of FIG. 1, the memory device 90 includes a three-dimensional (3D) memory array 92. The 3D memory array 92 includes memory cells 94 that may be programmable to store different states. In some examples, each memory cell 94 may be programmable to store two states (e.g., voltage having a voltage level indicative of or interpretable as a value), denoted as a logic 0 and a logic 1. In some examples, a memory cell 94 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 92 may include two or more two-dimensional (2D) memory decks 98 formed on top of one another (e.g., deck 98B is disposed on deck 98A). This may increase a number of memory cells that may be placed or created on a single die or substrate as compared with 2D arrays (e.g., increase a density of memory cells 94), which in turn may reduce production costs, or increase the performance of the memory device, or both. The memory array 92 may include two levels of memory cells 94 (e.g., disposed in parallel planes) and may thus be considered a 3D memory array; however, the number of levels is not limited to two. Each level may be aligned or positioned so that memory cells 94 may be aligned (exactly, overlapping, or approximately) with one another across each level, forming a memory cell stack 100. In some cases, the memory cell stack 100 may include multiple memory cells 94 laid on top of another while sharing an access line for both as explained below. In some cases, the memory cells 94 may be multi-level memory cells configured to store more than one bit of data using multi-level storage techniques.

In some examples, each row of memory cells 94 is connected to a word line 102, and each column of memory cells 94 is connected to a bit line 104 generally as a grid. The term access lines may refer to word lines 102, bit lines 104, or combinations thereof. Word lines 102 and bit lines 104 may be perpendicular (or nearly so) to one another and may create an array of memory cells 94. As shown in FIG. 1, the two memory cells 94 in a memory cell stack 100 may share a common conductive line such as a bit line 104. That is, a bit line 104 may be coupled with the bottom electrode of the upper memory cell 94 and the top electrode of the lower memory cell 94. Other configurations may be possible, for example, a third deck may share a word line 102 with a lower deck. In general, one memory cell 94 may be located at the intersection of two conductive lines such as a word line 102 and a bit line 104. This intersection may be referred to as a memory cell's address. A target memory cell 94 may be a memory cell 94 located at the intersection of an energized word line 102 and bit line 104; that is, word line 102 and bit line 104 may be energized to read or write a memory cell 94 at their intersection. Other memory cells 94 that are coupled with (e.g., connected to) the same word line 102 or bit line 104 may be referred to as untargeted memory cells 94.

Electrodes may be coupled with a memory cell 94 and a word line 102 or a bit line 104. The term electrode may refer to an electrical conductor, and in some cases, may be employed as an electrical contact to a memory cell 94. An electrode may include a trace, wire, conductive line, conductive material, or the like that provides a conductive path between elements or components of memory device 90. In some examples, a memory cell 94 may include a chalcogenide material positioned between a first electrode and a second electrode. One side of the first electrode may be coupled to a word line 102 and the other side of the first electrode to the chalcogenide material. In addition, one side of the second electrode may be coupled to a bit line 104 and the other side of the second electrode to the chalcogenide material. The first electrode and the second electrode may be the same material (e.g., carbon) or different.

Operations such as reading and writing may be performed on memory cells 94 by activating or selecting a word line 102 and bit line 104. In some examples, the bit lines 104 may also be referred to as digit lines. References to access lines, word lines, and bit lines, or their analogues, are interchangeable without loss of understanding or operation. Activating or selecting a word line 102 or a bit line 104 may include applying a voltage to the respective line. Word lines 102 and bit lines 104 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 94 may be controlled through a row decoder 106 and a column decoder 108. For example, a row decoder 106 may receive a row address from the memory controller 110 and activate the appropriate word line 102 based on the received row address. Similarly, a column decoder 108 may receive a column address from the memory controller 110 and activate the appropriate bit line 104. For example, memory array 92 may include multiple word lines 102, labeled WL_1 through WL_M, and multiple bit lines 104, labeled BL_1 through BL N, where M and N depend on the array size. Thus, by activating a word line 102 and a bit line 104, e.g., WL_2 and BL_3, the memory cell 94 at their intersection may be accessed. As discussed below in more detail, accessing memory cells 94 may be controlled through a row decoder 106 and a column decoder 108 that may include one or more doped materials that extend in a direction away from a surface of a substrate coupled to the memory array 92.

Upon accessing, a memory cell 94 may be read, or sensed, by sense component 112 to determine the stored state of the memory cell 94. For example, a voltage may be applied to a memory cell 94 (using the corresponding word line 102 and bit line 104) and the presence of a resulting current may depend on the applied voltage and the threshold voltage of the memory cell 94. In some cases, more than one voltage may be applied. Additionally, if an applied voltage does not result in current flow, other voltages may be applied until a current is detected by sense component 112. By assessing the voltage that resulted in current flow, the stored logic state of the memory cell 94 may be determined. In some cases, the voltage may be ramped up in magnitude until a current flow is detected. In other cases, predetermined voltages may be applied sequentially until a current is detected. Likewise, a current may be applied to a memory cell 94 and the magnitude of the voltage to create the current may depend on the electrical resistance or the threshold voltage of the memory cell 94. In some examples, a memory cell 94 may be programmed by providing an electric pulse to the cell, which may include a memory storage element. The pulse may be provided via word line 102, bit line 104, or a combination thereof.

The sense component 112 may include various transistors or amplifiers to detect and amplify a difference in the signals. The detected logic state of memory cell 94 may then be output through column decoder 108 via input/output 114. In some cases, the sense component 112 may be part of a column decoder 108 or row decoder 106. Alternatively, the sense component 112 may be connected to or coupled with column decoder 108 or row decoder 106. The sense component may be associated either with the column decoder or the row decoder.

A memory cell 94 may be set or written by activating the relevant word line 102 and bit line 104 and at least one logic value may be stored in the memory cell 94. Column decoder 108 or row decoder 106 may accept data, for example input/output 114, to be written to the memory cells 94. In the case of a memory cell including a chalcogenide material, a memory cell 94 may be written to store a logic state in the memory cell 94 by applying the first voltage to the memory cell 94 as part of the access operation based on coupling the first conductive line of the decoder (e.g., row decoder 106 or column decoder 108) with the access line (e.g., word line 102 or bit line 104).

In some cases, the memory device 90 may be in an IDLE phase; an IDLE phase may be a configuration with low power consumption, for example. In some examples the memory device 90 may be in an ACTIVE phase; an ACTIVE phase may be a configuration in which the memory device is immediately ready to execute received commands, for example. In some examples, the memory device may be in a PULSE phase; a PULSE phase may be a configuration during which a command is executed, for example, e.g., a target memory cell is accessed and biased to program or to read a logic state into or from the memory cell.

Based on the phase of the memory device 90 (e.g., IDLE phase, ACTIVE phase or PULSE phase, among others), the memory controller 110 may control the operation and voltages (e.g., read, write, re-write, refresh, discharge, shield, float) of memory cells 94 through the various components, for example, row decoder 106, column decoder 108, and sense component 112. In some cases, one or more of the row decoder 106, column decoder 108, and sense component 112 may be co-located with the memory controller 110.

The memory controller 110 may generate row and column address signals to activate the desired word line 102 and bit line 104. The memory controller 110 may also generate and control various other voltages or currents used during the operation of memory device 90. For example, the memory controller 110 may bias to a shielding voltage (e.g., a ground voltage) access lines adjacent to the target access line and/or access lines in a same group as the addressed access line. The memory controller 110 may also float other access lines unrelated to the addressed access line.

The memory controller 110 may be configured to select the memory cell 94 by applying a first voltage to the first conductive line of the decoder (e.g., row decoder 106 or column decoder 108). In some cases, the memory controller 110 may be configured to couple the first conductive line of the decoder with an access line (e.g., word line 102 or bit line 104) associated with the memory cell 94 based on selecting the memory cell 94. The memory controller 110 may be configured to apply the first voltage to the memory cell 94 based at least in part on coupling the first conductive line of the decoder with the access line.

In some examples, the memory controller 110 may be configured to apply a second voltage to a second conductive line of the decoder as part of the access operation. Applying the first voltage to the memory cell 94 may be based on applying the second voltage to the second conductive line. For example, the memory controller 110 may select the memory cell 94 based on an intersection of the first voltage and the second voltage. In some cases, a signal applied to the memory cell 94 as part of the access operation may have a positive polarity or a negative polarity.

In some examples, the memory controller 110 may receive a command comprising an instruction to perform the access operation on the memory cell 94 and identify an address of the memory cell 94 based on receiving the command. In some cases, applying the second voltage to the second conductive line may be based on identifying the address. If the access operation is a read operation, the memory controller 110 may be configured to output a logic state stored in the memory cell 94 based on applying the first voltage to the memory cell 94. If the access operation is a write operation, the memory controller 110 may store a logic state in the memory cell 94 based on applying the first voltage to the memory cell 94.

In some examples, the memory controller 110 may modify a state of the memory device 90 based on receiving the command. For example, the memory controller 110 may implement a transition from an IDLE phase to an ACTIVE phase based on receiving an access command. For example, the memory controller 110 may implement a transition from an ACTIVE phase to a PULSE phase based on receiving an access command. For example, the memory controller 110 may implement a transition from a PULSE phase back to an ACTIVE phase based on completion of a PULSE phase command. For example, the memory controller 110 may implement a transition from an ACTIVE phase back to an IDLE phase based on an access counter or a time counter meet respective threshold, as it will be described in detail below. For example, the memory controller 110 may keep memory device 90 in an ACTIVE phase if the access counter and the time counter are below respective threshold.

Figure 2:
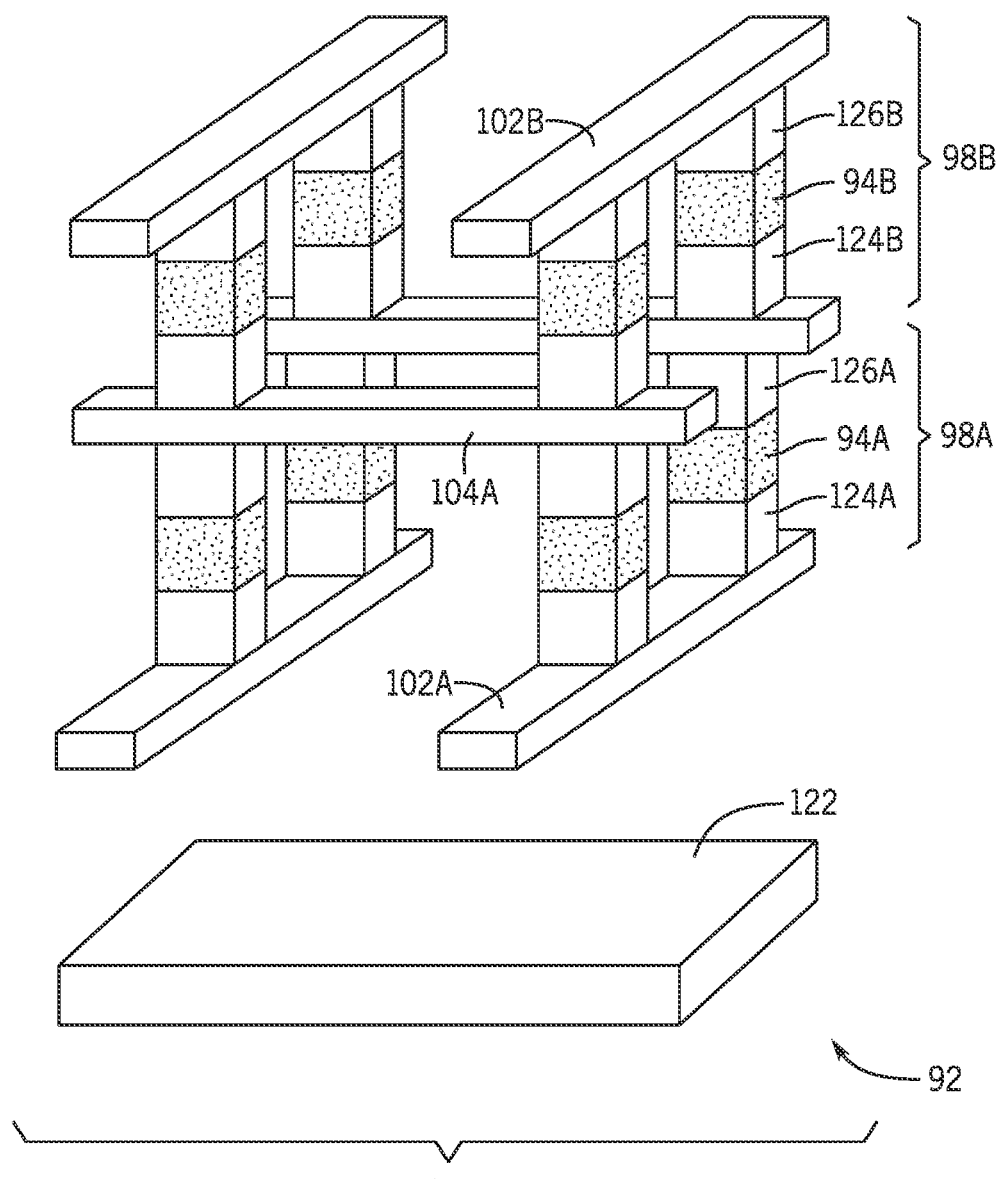
FIG. 2 is an orthogonal-view of a diagram illustrating the portion of the memory array of FIG. 2, according to an embodiment of the present disclosure.

FIG. 2 illustrates a perspective view of an exemplary 3D memory array supporting single transistor drivers in accordance with embodiments of the present disclosure. Memory array 92 may be an example of portions of memory array 92 described with reference to FIG. 1. Memory array 92 may include a first array or deck 98A of memory cells that is positioned above a substrate 122 and second array or deck 98B of memory cells on top of the first array or deck 98A. Memory array 92 may also include word line 102A and word line 102B, and bit line 104A, which may be examples of word line 102 and bit line 104, as described with reference to FIG. 1. Memory cells of the first deck 98A and the second deck 98B each may have one or more memory cells (e.g., memory cell 94A and memory cell 94B, respectively). Although some elements included in FIG. 2 are labeled with a numeric indicator, other corresponding elements are not labeled, though they are the same or would be understood to be similar, in an effort to increase visibility and clarity of the depicted features.

Memory cells 94 of the first deck 98A may include first electrode 124A, memory cell 94A (e.g., including chalcogenide material), and second electrode 126A. In addition, memory cells of the second deck 98B may include a first electrode 124B, memory cell 94B (e.g., including chalcogenide material), and second electrode 126B. The memory cells of the first deck 98A and second deck 98B may, in some examples, have common conductive lines such that corresponding memory cells of each deck 98A and 98B may share bit lines 104 or word lines 102 as described with reference to FIG. 1. For example, first electrode 124B of the second deck 98B and the second electrode 126A of the first deck 98A may be coupled to bit line 104A such that bit line 104A is shared by vertically adjacent memory cells 94. In accordance with the teachings herein, a decoder may be positioned above or below each deck if the memory array 92 includes more than one deck. For example, a decoder may be positioned above first deck 98A and above second deck 98B. In some cases, the memory cells 94 may be examples of phase-change memory cells or self-selecting memory cells.

The architecture of memory array 92 may be referred to as a cross-point architecture that uses threshold-type memory, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 122, which may be referred to as a two-dimensional memory. In some examples, three or four memory decks of memory cells may be configured in a similar manner in a three-dimensional cross point architecture.

In some examples, one or more of the memory decks may include a memory cell 94 that includes chalcogenide material. The memory cell 94 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 94 including chalcogenide material may be programmed to a logic state by applying a first voltage (e.g., threshold-type memory). By way of example and without being bound by a particular theory, when a particular memory cell 94 is programed, elements within the cell separate, causing ion migration. Ions may migrate towards a particular electrode, depending on the polarity of the voltage applied to the memory cell. For example, in a memory cell 94, ions may migrate towards the negative electrode. The memory cell 94 may then be read by applying a voltage across the cell to sense. The threshold voltage seen during a read operation may be based on the distribution of ions in the memory cell 94 and the polarity of the read pulse.

In some cases, a first voltage may be applied to a first conductive line of a decoder as part of an access operation of the memory cell 94. Upon applying the first voltage, the first conductive line may be coupled with the access line (e.g., word line 102A, word line 102B, or bit line 104A) associated with the memory cell 94. In some examples, a shielding voltage may be applied to a second conductive line of the decoder and the second conductive line may be coupled to an access line adjacent to the addressed access line or to an access line grouped with the addressed access line. In some examples, a floating voltage may be applied to access lines that are neither adjacent to nor grouped with the addressed access line (e.g., other access lines in the same deck as the addressed access line—not shown in FIG. 2).

Keeping the foregoing in mind, the memory controller 110 and/or the memory array 92 may be at least partially manufactured using layers of physical material to form a die and/or a physical chip or board. Through-silicon vias (TSVs) may be used between the layers of physical material to transmit signals. However, for at least the reasons discussed above, the TSVs may be unreliable and/or difficult to manufacture. Indeed, even when one TSV is non-functional, the whole stacked circuit may be discarded and rendered unusable. Thus, in accordance with the present embodiments, it may be desirable to include redundant TSVs with the TSVs to enable a routing of data around at least some of the TSVs as desired.

Figure 3:
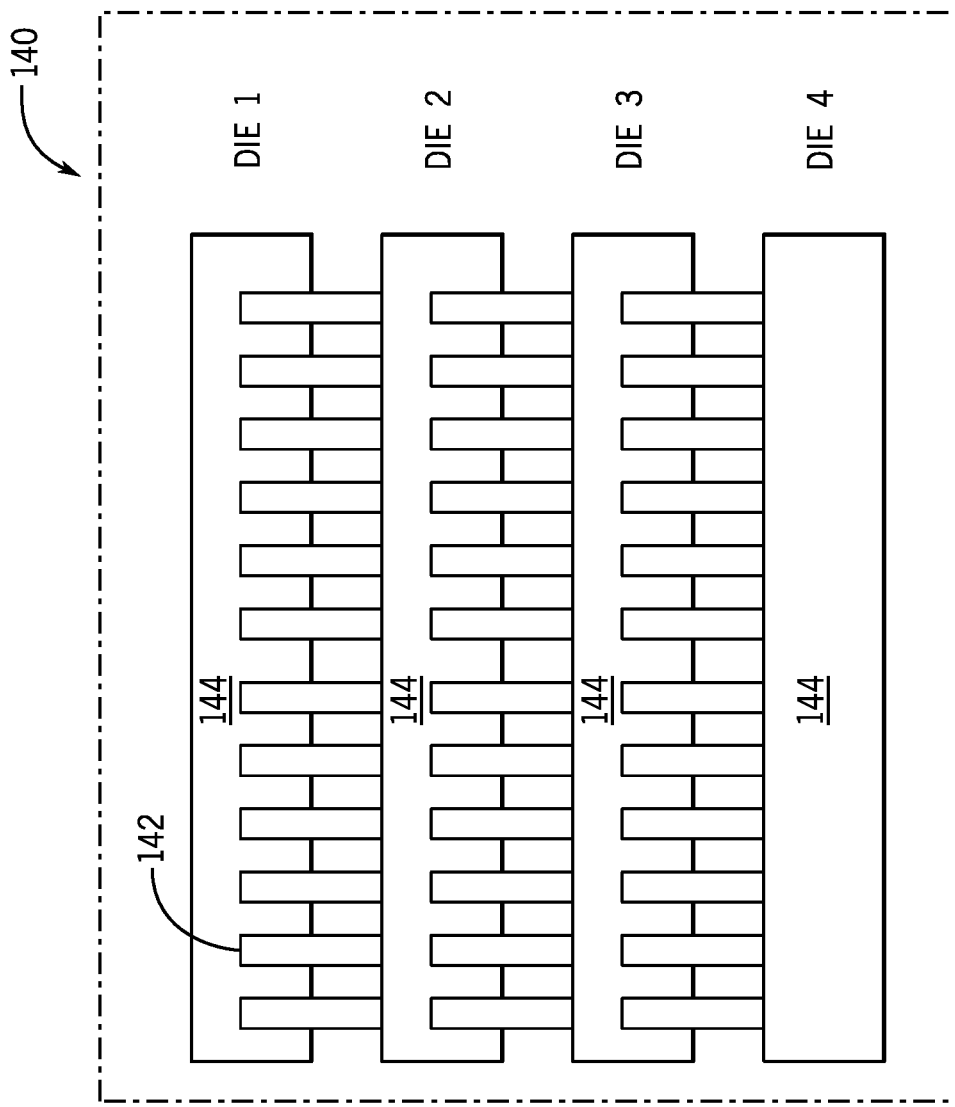
FIG. 3 is a block diagram illustrating a stacked layer circuit including multiple through-silicon vias (TSVs), according to an embodiment of the present disclosure.

To elaborate, FIG. 3 illustrates an example of a stacked circuit 140, in accordance with embodiments of the present disclosure. In a given memory device 90, many (e.g., one or more) TSVs 142 may be implemented to electrically/communicatively couple between die 144 of the stacked circuit 140. Each of the TSVs 142 used for non-power connections (e.g., transmitted digital signals for communication of data as opposed to powering of components) between the die 144 may be operational or else the respective die 144 having the non-functional TSV 142 connection may be non-functional. Here, four die 144 are physically encapsulated in a packaging material (not shown). Thus, when one die 144 is non-functional, each interconnected die 144 (e.g., the other three die 144) may also be rendered at least partially non-functional, and thus be disregarded or discarded. Including additional TSVs 142 may improve operation of the memory device 90 by increasing a tolerance of the memory device 90 to non-functional TSVs 142 since a faulty TSV 142 may be replaced by the additional TSV 142.

It is noted that these systems and methods described herein may be able to be used with a wide variety of TSV designs. Furthermore, redundant TSVs 142 may be included per groups of TSVs 142. Any number of TSVs 142 may be grouped together and share a redundant TSV 142.

Figure 4:
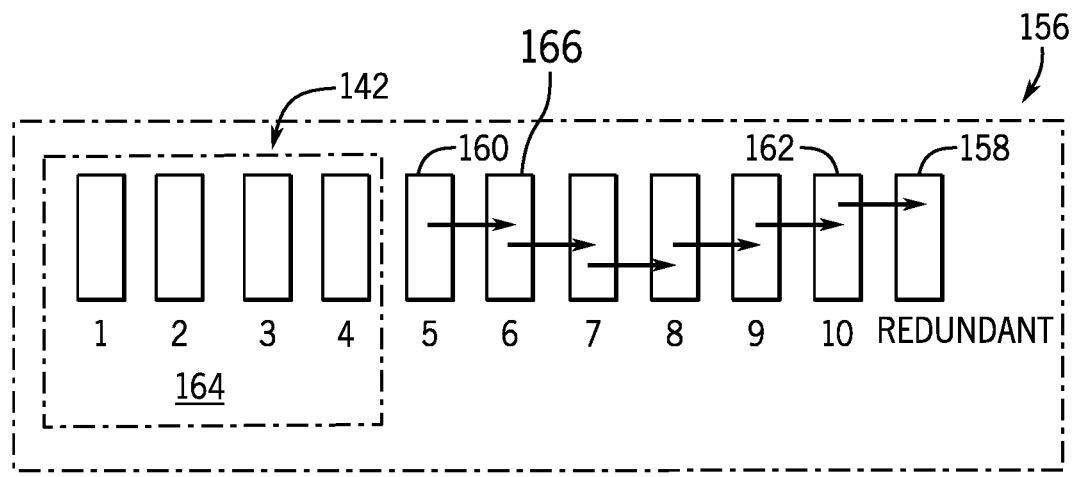
FIG. 4 is a block diagram of the layer of the stacked layer circuit of FIG. 3 that illustrates a redundant TSV and a TSV to be replaced, according to an embodiment of the present disclosure.

FIG. 4 is a block diagram illustrating a layer 156 associated with the stacked circuit 140 of FIG. 3, according to an embodiment of the present disclosure. The layer 156 may include multiple TSVs 142, including a TSV 142 designated as a redundant TSV 158 and a faulty TSV 160 determined to be replaced. The multiple TSVs 142 may be disposed between two die 144 of the stacked circuit 140. To replace the faulty TSV 160, data for the faulty TSV 160 (e.g., in this case "5" since the faulty TSV 160 corresponds to the fifth TSV 142B) is shifted over one TSV 142 and transmitted through TSV 166 (e.g., adjacent TSV 142) as opposed to being transmitted through the faulty TSV 160. This shifting of the routing for the faulty TSV 160 triggers a downstream shifting until a last TSV 142 (e.g., TSV 162) is shifted to correspond to the redundant TSV 158. Upstream TSVs 164 may remain unshifted and use original routing configurations. It is noted that shifting of data to downstream TSVs 142 occurs between identification of a faulty TSV (or a TSV to be skipped) and a transmission of the data through the TSVs 142. Indeed, the shifting may occur before the data for transmission without the faulty TSV 160 is transmitted through any TSVs 142.

Figure 5:
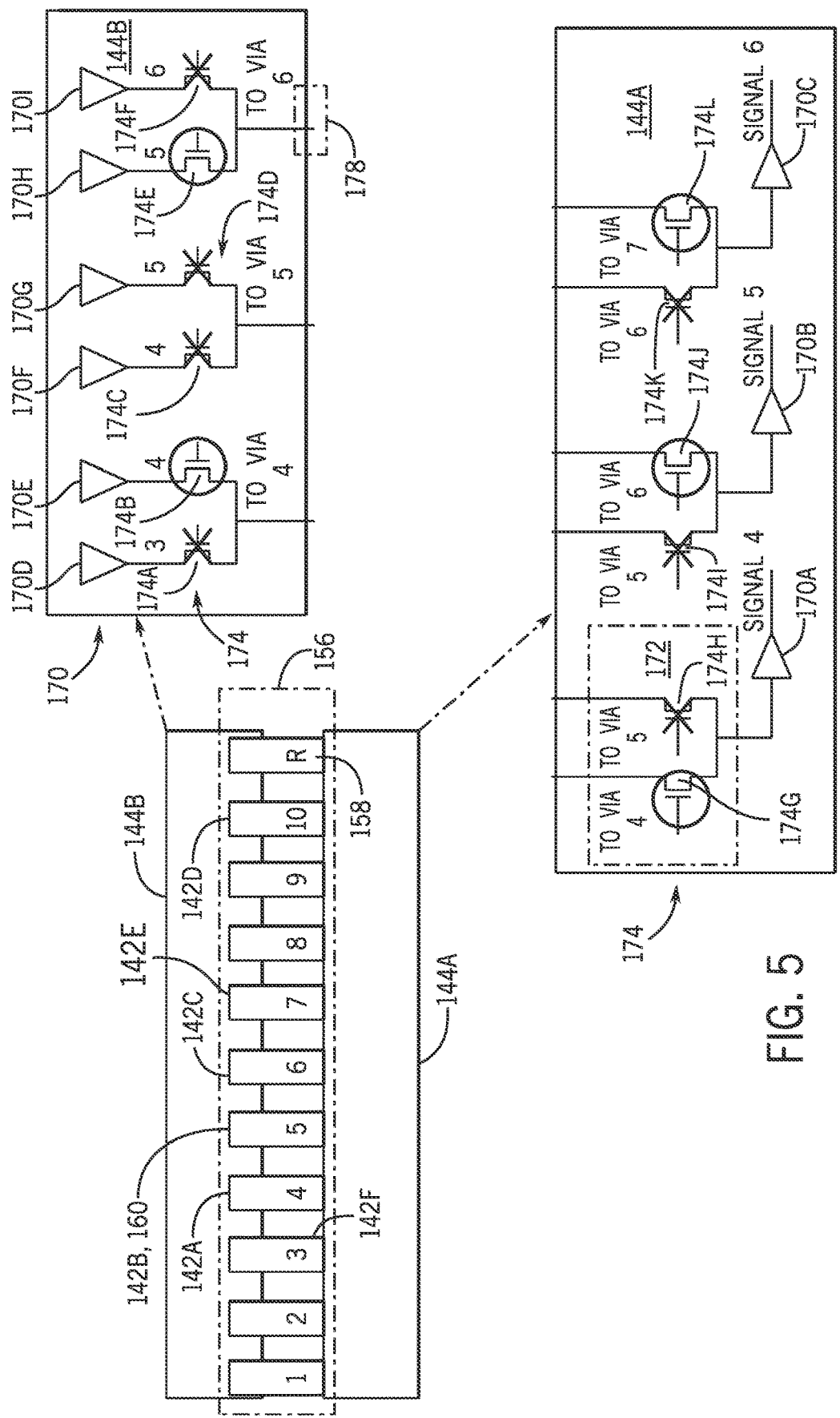
FIG. 5 is a block diagram illustrating buffer circuitry implemented when using the redundant TSV of FIG. 4 to replace the TSV, according to an embodiment of the present disclosure.

To elaborate on routing and/or buffer changes used to perform the shifting, FIG. 5 is a block diagram illustrating buffer circuits 170 (e.g., 170A-170I), a portion of which is used when using the redundant TSV 158 to replace the TSV 160, according to an embodiment of the present disclosure. FIG. 5 also illustrates transistors 174 (174A, 174B, 174C, 174D, 174E, 174F, 174G, 174H, 174I, 174J, 174K, 174L). It is noted that although not particularly illustrated in FIG. 5, each buffer circuit 170 may have routing and/or a transmission path leading to its respective input/output pin to receive and/or transmit signals through. These paths are shown with respect, for example, buffer circuit 170A but are omitted for buffer circuit 170D. Input/output paths used to transmit signals (e.g., "4", "SIGNAL 4") may couple to any variety of circuitry and/or transmission paths of the die 144. In this way, some buffer circuits 170 may couple to one circuit of die 144A while some buffer circuits 170 may couple to another circuit of die 144B. Any suitable combination of interconnections may be used with the systems and methods described herein.

When a faulty TSV 160 is not being avoided, each selection circuitry 172 may transmit in a first configuration (e.g., using signals transmitted generally on the right portion of circuitry). For example, the combination of inputs/outputs used for a fourth TSV 142A show a configuration of routing circuitry to a via not being affected by shifting operations. Indeed, signals to be transmitted via the fourth TSV 142A (e.g., "4") are received at the buffer circuit 170D, then transmitted through the transistor 174B (while transistor 174A is off), then transmitted through the fourth TSV 142A, then transmitted through the transistor 174G, and eventually through the buffer circuitry 170A (while the transistor 174H is off). Routing used to support a "normal" or unadjusted transmission may be adjusted when it is desired to skip a TSV 142 (e.g., route around, not use). Indeed, to shift routing from the TSV 160, routing to and from some of the buffer circuits 170 may be adjusted, which may affect related circuits associated with them (e.g., on or off status of related transistors 174). As illustrated, each TSV 142 corresponds to three buffer circuits 170 and four transistors 174, however it should be understood that any combination of buffer circuits 170, transistors 174 and/or or other selection and routing circuitry may be used to route inputs between various TSVs 142, where an input to a respective TSV 142 is an output from a data source (e.g., data generating hardware or software). Accordingly, in some embodiments, on or off status of related transistors 174 may be adjusted to route inputs between various TSVs 142 (as illustrated in FIG. 5), while in other embodiments, on or off status of related transistors 174 may not need to be adjusted to route inputs between various TSVs 142 (not illustrated in FIG. 5). For example, a fourth TSV 142A corresponds to buffer circuits 170D, 170E, and 170A, a fifth TSV 142B corresponds to buffer circuits 170F, 170G, and 170B, and a sixth TSV 142C corresponds to buffer circuits 170H, 170I, and 170C.

Buffer circuits 170 may couple to various input pins and/or output pins and enable transmission of signals between die 144. Indeed, the buffer circuits 170 may couple to processing circuitry that accesses the memory device 90 or another memory to store data and/or perform a variety of computing tasks. The buffer circuits 170 may additionally or alternatively be coupled to routing circuitry, such as routing circuitry upstream from the buffer circuits 170D-170I to guide which data goes to which buffer circuits 170. Indeed, in some cases, the buffer circuits 170 may couple to one or more access lines (e.g., bit lines 104, word lines 102). When shifting data to skip a TSV 142, a previous input to the TSV 142 may be shifted to an adjacent TSV 142. This shifting may be facilitated by routing circuitry (e.g., communicative couplings not illustrated) that guides an input to the buffer circuit 170F for transmission via the fifth TSV 142B, for example, to an input of the buffer circuit 170H for transmission via the sixth TSV 142C.

Each buffer circuit 170 may respectively couple to its corresponding selection circuitry 172. The selection circuitry 172 may include any suitable switching and routing circuitry, such as two transistors 174. Prior to shifting, buffer circuits 170 and selection circuitry 172 may route data between the die 144 using designated combinations of TSV 142 and buffer circuits 170. For example, the buffer circuit 170D sends or receives data (e.g., "3") that may be originally associated with a third TSV 142F through the fourth TSV 142A when transistor 174A is turned on (and transistor 174B is turned off), and the buffer circuit 170D sends or receives data associated with the fourth TSV 142A when transistor 174B is turned on (and the transistor 174A is turned off). Indeed, data may be routed for transmission to the buffer circuitry 170 for transmission via the TSVs 142 in a relative order (e.g., fourth position corresponding to data "4" output from buffer circuit 170E, third position corresponding to data "3" output from buffer circuit 170D) and shifting may preserve the relative order of data transmitted such that circuitry corresponding to a sixth data positon (e.g., sixth TSV 142C) may be used to transmit data corresponding to a fifth data position and data of the sixth data position may instead be transmitted using circuitry corresponding to the seventh data position (e.g., seventh TSV 142E), and so on until the redundant TSV 158 is used to transmit shifted data corresponding to the tenth data position (or an otherwise last data position). It is noted that TSVs 142 may transmit serial or parallel data, or any suitable type of data.

To shift around the fifth TSV 142B (e.g., faulty TSV 160 and/or TSV identified for replacement), the transistor 174C, transistor 174D, and transistor 174I associated with the fifth TSV 142B are each turned off. This may stop signals from transmitting through the fifth TSV 142B (e.g., faulty TSV or TSV for replacement, TSV 142B, 160) and/or or reduce the signal transmission to a negligible amount. Data (e.g., "5") originally transmitted to the buffer circuit 170G may be routed to the buffer circuit 170H, data (e.g., "6") originally transmitted via the sixth TSV 142C from the buffer circuit 170I may be stopped by turning off the transistor 174F, and data (e.g., "6") transmitted to a buffer circuit 170 for the seventh TSV 142E is used to transmit the sixth position data (e.g., "6"), although not particularly illustrated. Routing used to shift data (e.g., "5", "6", "7", and so on) from the original buffer circuits 170 to adjacent buffer circuits 170 may be coupled to the buffer circuits 170 and not depicted. The routing may use switches (e.g., transistors) that turn on in response to a control signal from a processor or control system (e.g., memory controller) to route between the buffer circuits 170.

Turning on transistor 174E and turning off transistors 174D and 174F may route data (e.g., "5") through the sixth TSV 142C via output 178 as opposed to the fifth TSV 142B. After signals are shifted at the die 144B (e.g., by switching one or more of the transistors 174 and/or adjusting any upstream routings), signals being received from the sixth TSV 142C at transistor 174I correspond to the transmission for the fifth TSV 142B sent to the buffer circuits 170G and 170H, as opposed to the signals for the transmission of the sixth TSV 142C sent to the buffer circuits 170I (hence labeling of the output as "SIGNAL 5"). When routing is implemented, signals for the transmission associated with the sixth TSV 142C (e.g., "6") may be transmitted through the seventh TSV 142E for output via buffer circuit 170C using the transistor 174L (e.g., as "SIGNAL 6"). Shifting of inputs to outputs of adjacent buffers may continue until the redundant TSV 158 is used to transmit signals for the tenth TSV 142D.

Selection circuitry 172 may use any suitable circuitry as a switch or as routing circuitry to guide signals from a signal source to a signal target through a suitable TSV 142. Indeed, in some cases, the selection circuitry 172 may use fuse-locked transmission routes as opposed to transistors 174. In this way, when its determined that a faulty TSV 160 is to be routed around and not used, one or more fuses may make the routing permanent. When routing is made permanent, changes to the routing may not be further made. Indeed, when permanently routing around the faulty TSV 160, the memory device 90, a control system, or a user may be unable to reset the routing without first replacing or resetting the fuse. Other routing circuitry may be used, such as combinational logic or other switching circuitry, such as multiplexers. It is also noted that in some cases, as opposed to the selection circuitry 172 being based on fuses, the selection circuitry 172 may receive a signal from a fuse and/or generated based on a fuse state. In this way, a blown fuse may protect a logic high from changing state when transmitted to the selection circuitry 172 (provided that stacked circuit 140 is powered on).

In some cases, a control system for the stacked circuit 140 may transmit selection signals to one or more of the transistors 174 to turn on or turn off each one respectively based on whether routing is to be performed or not. Furthermore, the control system may determine that one or more TSVs 142 are faulty, and thus are to be bypassed, in response to results of the self-test or a selection received via a graphical user interface. The control system may, in response to determining that the one or more TSVs 142 are faulty (and thus determining to bypass one or more TSVs 142), transmit a first control signal to switch routing (e.g., selection circuitries 172, buffer circuits 170, routing coupled to the buffer circuits 170) from a first configuration to a second configuration. The control system may, while routing is occurring, generate first data using a first data source. When the routing is in the second configuration, the control system may transmit the first data from the first data source through another TSV 142, thereby bypassing one or more faulty TSVs 142. Switching the routing from the first configuration to the second configuration may involve the control system transmitting a second control signal to cause a fuse coupled to a gate of the transistors 174 to change state. The fuse changing state may cause the bypassing of the first via (e.g., TSV 142, other suitable via) and help contribute to the routing operations described above by generally causing data originally to be routed to the one or more faulty TSVs 142 to be routed to a different, neighboring TSV 142 that is not faulty (e.g., a different via adjacent to the first via).

Indeed, as described above, a control system of the stacked circuit 140 and/or of the memory device 90 may run a test (e.g., self-test) to determine whether usage of the TSVs 142 over time has negatively affected performance of one or more TSVs 142 enough to stop using the damaged TSV 142. When performance deviates a threshold amount (e.g., 1%, 5%) from suitable operating ranges, the control system may activate one or more portions of the selection circuitry 172 to shift the data from the damaged TSV 142 to an adjacent TSV 142. The test performed by the control system may involve test data and target results, where a deviation from the target results in generated results through the test may indicate whether one or more TSVs 142 are to be bypassed. The test may involve transmitting the test data and identifying values received at output pins to determine whether degradation or changes resulted in the output of the test data.

Systems and methods are discussed herein in terms of the stacked circuit 140 being disposed within and/or associated with a memory device 90. However, it should be understood that shifting of TSVs 142 may be beneficial for implementation in a wide-variety of circuitry. It is also noted that memory circuitry may have particular challenges and thus may benefit relatively more from shifting of TSVs 142 systems and methods generally based on a sheer density of TSVs 142 that may be used in a memory device.

Technical effects of the present disclosure include systems and methods that enable memory systems to bypass one or more through-silicon vias (TSVs). Circuitry may include one or more redundant TSVs. Data originally routed to the TSV may be routed to an adjacent TSV to bypass the TSV. Bypassing the TSV may trigger a shifting of data through a group of TSVs. Shifting of the data may stop when the data for a last TSV is shifted for transmission using the redundant TSV. Redundant TSVs may be included for single-direction and dual-directional data transmissions between die for both TSVs that just transmit signals from a first die to a second die and for TSVs that transmit and receive signals from a first die and a second die, and thus be used to improve a wide variety of circuitry at least in part by extending a duration of time that the circuitry is able to be used for (e.g., by extending an amount of time a set number of TSVs made be used) and/or by improving manufacturing of the circuitry by reducing a likelihood that a device is to be discarded due to one or more undesirable TSVs.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a first die comprising a first circuit, wherein the first circuit is configured to couple to a first buffer circuit and a second buffer circuit, and wherein the first buffer circuit is configured to receive first data generated by a first data source and the second buffer circuit is configured to receive second data generated by a second data source, and wherein the second data is independent of the first data;
a second die comprising a second circuit;
a material layer disposed between the first die and the second die and comprising a plurality of through-silicon vias (TSVs) for electrically coupling the first die to the second die, wherein a first TSV of the plurality of TSVs is associated with only three buffer circuits and is configured to electrically couple the first circuit to the second circuit, and a second TSV of the plurality of TSVs comprises a redundant TSV configured to electrically bypass the first TSV to couple the first circuit to the second circuit if a fault is detected in the first TSV; and
a control system configured to:
at a first time:
transmit the first data from the first circuit to the second circuit using the first TSV; and
transmit the second data from the first circuit to the second circuit using a third TSV of the plurality of TSVs; and
at a second time:
turn off a first switch and turn on a second switch to route third data from the first circuit to the second circuit using the third TSV, thereby bypassing the first TSV; and
turn off a third switch and turn on a fourth switch to route fourth data from the first circuit to the second circuit using the second TSV as opposed to the third TSV.

2. The device of claim 1, wherein the material layer comprises silicon.

3. The device of claim 1, wherein the first TSV is associated with four switches.

4. The device of claim 1, wherein the first TSV and the second TSV comprise a non-power connection.

5. The device of claim 1, wherein the first circuit, or the second circuit, or both are configured to couple to a plurality of access lines, and wherein a plurality of memory cells are located at intersections of the access lines.

6. The device of claim 5, wherein the plurality of access lines comprise bit lines and word lines arranged in a grid, wherein the grid comprises a plurality of memory cells disposed in a same plane with additional memory cells in one or more other parallel planes, and wherein a subset of the plurality of memory cells share an access line of the plurality of access lines.

7. The device of claim 1, wherein the control system is configured to:
at the second time:
turn off the first switch, turn off a fifth switch, and turn on the second switch for an overlapping duration of time to enable the first data from the first circuit to transmit to the second circuit using the third TSV as opposed to the first TSV.

8. A method, comprising:
determining that a first via is faulty, wherein the first via is associated with only three buffer circuits;
in response to determining that the first via is faulty, transmitting a first control signal to switch selection circuitry from a first configuration to a second configuration;
generating first data using a first data source and transmitting the first data to a first buffer circuit;
generating second data using a second data source and transmitting the second data to a second buffer circuit, wherein the second data is independent of the first data;
generating third data using the first data source on a first die before determining that the first via is faulty;
transmitting the third data from the first data source through the first via to a second die, wherein a plurality of vias comprises the first via and second via; and
when the selection circuitry is in the second configuration, transmitting the first data from the first buffer circuit to the second buffer circuit via routing circuitry, wherein the second buffer circuit is configured to transmit the first data through a second via configured to bypass the first via, wherein the first via and the second via are formed through a material layer disposed between the first die and the second die for electrically coupling the first die to the second die.

9. The method of claim 8, wherein switching the selection circuitry from the first configuration to the second configuration comprises:
transmitting a second control signal to turn off a first switch and turn on a second switch to route third data from the first data source to the second via; and
transmitting a third control signal to turn off a third switch and turn on a fourth switch to route fourth data from the second data source to a third via as opposed to using the second via to transmit the fourth data.

10. The method of claim 8, wherein switching the selection circuitry from the first configuration to the second configuration comprises:
transmitting a second control signal to cause a fuse to change state, wherein the fuse is coupled to a gate of a switch of the selection circuitry, and wherein the fuse changing state causes bypassing of the first via.

11. The method of claim 8, wherein the second configuration uses a redundant via previously unused.

12. The method of claim 8, wherein transmitting the first control signal to switch the selection circuitry involves configuring a buffer circuit and transistors to change a routing of signals to inputs of a plurality of vias.

13. A memory device, comprising:
a first die comprising a first circuit, wherein the first circuit is configured to couple to a first buffer circuit and a second buffer circuit, wherein the first buffer circuit is configured to receive first data generated by a first data source and the second buffer circuit is configured to receive second data generated by a second data source, and wherein the second data is independent of the first data;
a second die comprising a second circuit;
routing circuitry configured to route data from the first buffer circuit to the second buffer circuit;
a material layer disposed between the first die and the second die and comprising a plurality of through-silicon vias (TSVs) for electrically coupling the first die to the second die, wherein a first TSV of the plurality of TSVs is associated with only three buffer circuits and is configured to electrically couple the first circuit to the second circuit, wherein a second TSV of the plurality of TSVs comprises a redundant TSV configured to electrically bypass the first TSV to couple the first circuit to the second circuit if a fault is detected in the first TSV; and
a controller configured to:
before the fault is detected in the first TSV, generate third data using the first data source on the first die and transmit the third data from the first data source through the first TSV to the second die;
detect the fault in the first TSV; and
in response to detecting the fault, transmit the first data from the first buffer circuit to the second buffer circuit via the routing circuitry, wherein the second buffer circuit transmits the first data from the first circuit to the second circuit at least partially through the second TSV, thereby bypassing the first TSV.

14. The memory device of claim 13, wherein the first data source is configured to generate the first data based at least in part on an access operation to read or write data to one or more memory cells.

15. The memory device of claim 13, wherein the material layer comprises silicon.

16. The memory device of claim 13, wherein the first circuit is configured to couple to a third buffer circuit, wherein the first buffer circuit is coupled to a first switch, wherein the third buffer circuit is coupled to a second switch, and wherein the first TSV couples to the first switch and the second switch.

17. The memory device of claim 13, wherein the controller is configured to transmit the first data from the first circuit to the second circuit at least partially through the second TSV at least in part by:
turning off a first switch and turning on a second switch to route a first portion of the first data from the first circuit to a third TSV as opposed to the first TSV; and
turning off a third switch and turning on a fourth switch to route a second portion of the first data from the first circuit to a fourth TSV of the plurality of TSVs as opposed to the third TSV.

18. The memory device of claim 17, wherein the controller is configured to turn on and off a combination of switches to cause a third portion of the first data from the first circuit to route to the second TSV as opposed to an adjacent TSV of the plurality of TSVs to the second TSV.

19. The memory device of claim 16, wherein the second circuit is configured to couple to a fourth buffer circuit, wherein the fourth buffer circuit is coupled to a third switch and a fourth switch, and wherein the first TSV is coupled to the third switch and the fourth switch.

* * * * *